United States Patent [19]
Mancevski

[11] Patent Number: 6,146,227
[45] Date of Patent: Nov. 14, 2000

[54] METHOD FOR MANUFACTURING CARBON NANOTUBES AS FUNCTIONAL ELEMENTS OF MEMS DEVICES

[75] Inventor: Vladimir Mancevski, Austin, Tex.

[73] Assignee: Xidex Corporation, Austin, Tex.

[21] Appl. No.: 09/407,394

[22] Filed: Sep. 28, 1999

Related U.S. Application Data

[60] Provisional application No. 60/102,159, Sep. 28, 1998.

[51] Int. Cl.[7] ....................................................... H01J 9/02
[52] U.S. Cl. ................................................ 445/24; 445/50
[58] Field of Search ......................................... 445/24, 50

[56] References Cited

U.S. PATENT DOCUMENTS

| | | | |
|---|---|---|---|
| 5,764,004 | 6/1998 | Rabinowitz | 315/169.1 |
| 5,773,921 | 6/1998 | Keesmann et al. | 313/309 |
| 5,973,444 | 10/1999 | Xu et al. | 313/309 |

FOREIGN PATENT DOCUMENTS

| | | |
|---|---|---|
| 10203810A | 8/1998 | Japan . |
| WO 98/11588 | 3/1998 | WIPO . |

OTHER PUBLICATIONS

W. Z. Li et al., Large–Scale Synthesis of Aligned Carbon Nanotubes, Dec. 6, 1996, *Science*, 1701–1703.

*Primary Examiner*—Kenneth J. Ramsey
*Attorney, Agent, or Firm*—Gray Cary Ware & Freidenrich, LLP

[57] ABSTRACT

A system and method for manufacturing carbon nanotubes as functional elements of MEMS devices. The method of the present invention comprises the steps of preparing a MEMS substrate for synthesis of a carbon nanotube. A nanosize hole or catalyst retaining structure is fabricated on the MEMS substrate in which a nanotube catalyst is deposited. A nanotube is then synthesized within the nanosize hole.

69 Claims, 4 Drawing Sheets

METHOD FOR MANUFACTURING CARBON NANOTUBES AS FUNCTIONAL ELEMENTS OF MEMS DEVICES

RELATED APPLICATIONS

This application claims the benefit of U.S. Provisional Application No. 60/102,159 filed on Sep. 28, 1998. Additionally, this application incorporates by reference the prior U.S. Provisional Application No. 60/102,159 filed on Sep. 28, 1998 entitled "Method for Manufacturing Carbon Nanotubes" to Vladimir Mancevski.

TECHNICAL FIELD OF THE INVENTION

The present invention relates generally to methods of manufacturing carbon nanotubes and, more particularly, to a system and method for manufacturing carbon nanotubes as functional elements of MEMS devices.

BACKGROUND OF THE INVENTION

Existing methods in growing nanotubes cannot fabricate an individual precisely-located hole. Existing methods rely on methods that produce an array of uniformly-distributed holes, and thus uniformly-distributed carbon nanotubes.

Therefore a method of growing a carbon nanotube having a controlled shape, length and orientation at a precisely controlled location is extremely desirable.

SUMMARY OF THE INVENTION

The present invention provides a method for fabricating individual aligned carbon nanotubes as functional elements of MEMS devices.

More specifically, the present invention provides a system and method for manufacturing carbon nanotubes as functional elements of MEMS devices. The method of the present invention comprises the steps of preparing a MEMS substrate for growth of a carbon nanotube. A nanosize hole or nanosize catalyst retaining structure (NCRS) is fabricated in a layer on the MEMS substrate in which a nanotube catalyst is deposited. A nanotube is then synthesized within the NCRS, after which the layer may be removed if needed.

A key innovation associated with the present invention is the manufacturing of at least one carbon nanotube on a MEMS substrate in a process suitable for large-scale manufacturing. The method of manufacturing provided by the present invention opens the door to many other applications where an individual carbon nanotube, or collection of individual carbon nanotubes, can be used as functional element(s) or device(s).

A technical advantage of the present invention is that the method of the present invention is designed to produce aligned carbon nanotubes with controlled shape, diameter, wall thickness, length, orientation, and location of growth.

Another technical advantage of the present invention is that the method of the present invention allows fabrication of a NCRS with precise dimensions and location that will serve as a template or pore for a carbon nanotube with controllable length, orientation, diameter, and location. The method can be implemented so as to be compatible with microelectromechanical manufacturing systems (MEMS) fabrication processes.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Figure 1:
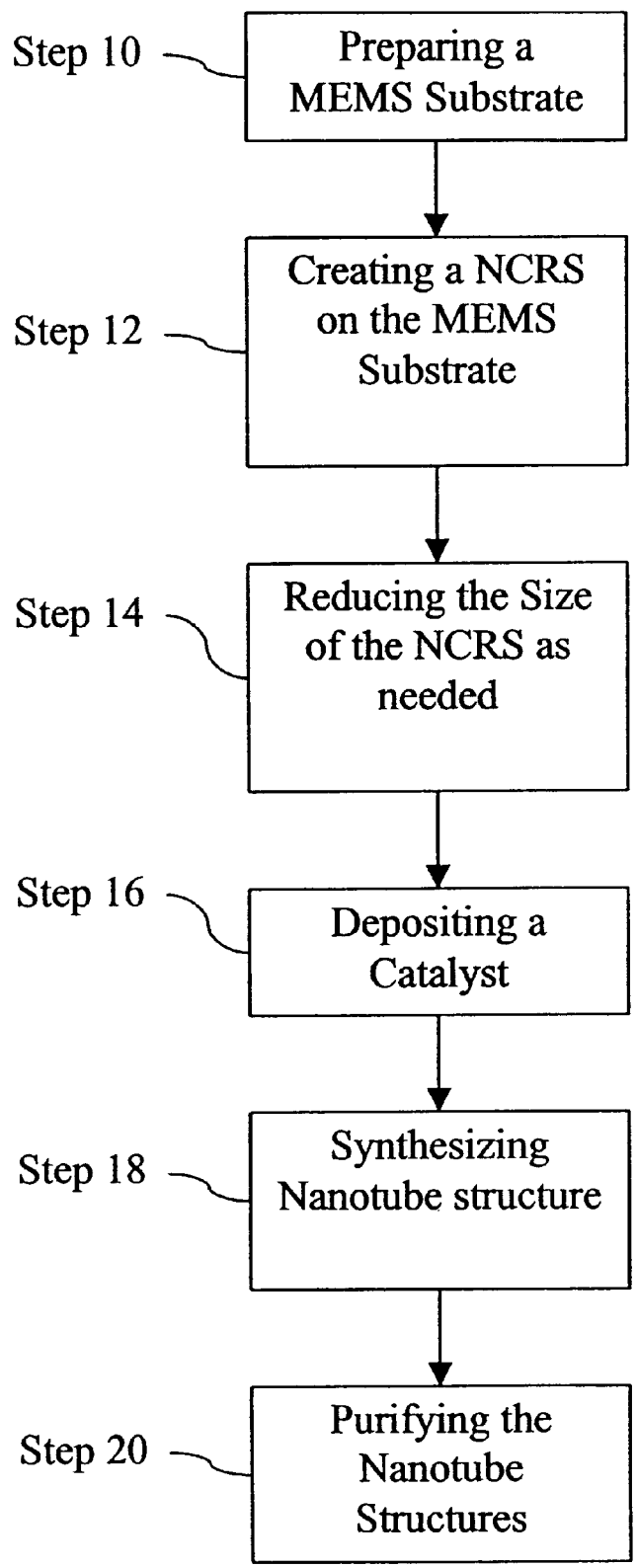
FIG. 1 illustrates one method of the present invention as a flow diagram.

Preferred embodiments of the present invention are illustrated in the FIGURES, like numerals being used to refer to like and corresponding parts of the various drawings.

The method for nanosize hole fabrication of the present invention involves fabrication of an individual nanosize hole with the ability to control its alignment, diameter, depth, and location.

The present invention provides a method for manufacturing carbon nanotubes as functional elements of MEMS or semiconductor devices with the ability to control the carbon nanotubes alignment, diameter, shape, length, and location.

The method of the present invention comprises the steps of preparing a MEMS substrate suitable for growth of a carbon nanotube. A nanosize hole or nanoscale catalyst retaining structure (NCRS) is fabricated in a layer on the MEMS substrate in which a nanotube growth catalyst is deposited. A nanotube is then grown within the nanosize hole.

The method of the present invention allows fabrication of a NCRS with precise dimensions and location that will result in carbon nanotube(s) with desired size, orientation, and location. The method can be implemented so as to be compatible with microelectromechanical manufacturing systems (MEMS) fabrication processes.

One such use for these carbon nanotubes is their use as scanning probe tool tips and, in particular, Atomic Force Microscope (AFM) tips. A key innovation associated with the present invention is the manufacturing of an individual aligned carbon nanotube on a MEMS structure, such as AFM cantilever, in a process suitable for large-scale manufacturing. In this embodiment of the present invention, the AFM tip is the functional element and the MEMS structure is the AFM cantilever. Other MEMS structures may include a flat panel display, a tuning fork probe and a torsional cantilever for magnetic resonance force microscopy. Other carbon nanotube functional elements include flat panel display pixels, a molecular wire, or a nanotube used as a molecular antenna. The present invention need not be limited to a particular MEMS structure or carbon nanotube functional element. The method of manufacturing provided by the present invention opens the door to many other applications where an individual carbon nanotube, or collection of individual carbon nanotubes, can be used as functional element(s) or device(s). This allows the manufacture of carbon nanotube structures at a specified location, directly on a MEMS substrate, instead of forming the carbon nanotube structure elsewhere and then mounting the structure to the MEMS substrate.

Process parameters can be adjusted so as to make this nanotube fabrication process compatible with standard AFM cantilever fabrication processes. This approach is suitable for fabricating the carbon nanotube tip and the silicon cantilever in one continuous process, ideal for large-scale manufacturing.

The method of the present invention encompasses the individual process steps described below as employed to produce carbon nanotubes with controlled parameters. Additionally, the method includes the process consisting of the individual process steps listed below wherein an individual process step may be replaced by a similar process step that essentially achieves the same function.

FIG. 1 illustrates the method of the present invention as a flow diagram. First, in step 10, the MEMS substrate is prepared for synthesis of a carbon nanotube.

Next, in step 12, an NCRS with controlled shape, diameter and length is made in a layer at a specific desired location on the MEMS substrate. If the NCRS has high aspect ratio, the NCRS may be used to control the shape, length, and diameter of the carbon nanotube. This method of control is referred to as a template method. If the NCRS has small aspect ratio, the NCRS may control the diameter of the carbon nanotube. This method of control is referred to as a pore method.

At step 14, the size or diameter of the NCRS is evaluated and reduced as needed with similar or same methods as used to fabricate it or with similar or same methods as used to coat it, as known to those skilled in the art. These methods include electrochemical deposition, chemical deposition, electro-oxidation, electroplating, sputtering, thermal diffusion and evaporation, physical vapor deposition, sol-gel deposition, and chemical vapor deposition.

At step 16, a nanotube catalyst is placed within an individual NCRS. Methods for placing this catalyst include electrochemical deposition, chemical deposition, electro-oxidation, electroplating, sputtering, thermal diffusion and evaporation, physical vapor deposition, sol-gel deposition, and chemical vapor deposition. This catalyst may be placed on a specific surface of the NCRS, such as the bottom surface, or all surfaces of the NCRS.

In step 18 carbon nanotubes with controllable shape, diameter, orientation, wall thickness and length, are synthesized from within an individual NCRS Methods for synthesizing include thermal deposition of hydrocarbides, a chemical vapor deposition process wherein a reaction time of said chemical vapor deposition process is manipulated to control a length of the carbon nanotube, and a chemical vapor deposition process wherein a process parameter of said chemical vapor deposition process is manipulated to control a wall thickness of the carbon nanotube.

At step 20, the template layer containing the synthesized carbon nanotubes may be removed if needed.

Afterwards, the carbon nanotubes are purified to remove impurities.

Reiterating the major process steps of the present invention, implemented sequentially, are:

(1) preparation of a MEMS substrate;
(2) creating an NCRS in a layer on the MEMS substrate;
(3) reducing the diameter of the NCRS;
(4) depositing a catalyst within the NCRS;
(5) synthesizing the nanotube; and
(6) removing the template layer on the MEMS substrate if needed; and
(7) purifying the nanotubes.

Figure 2:
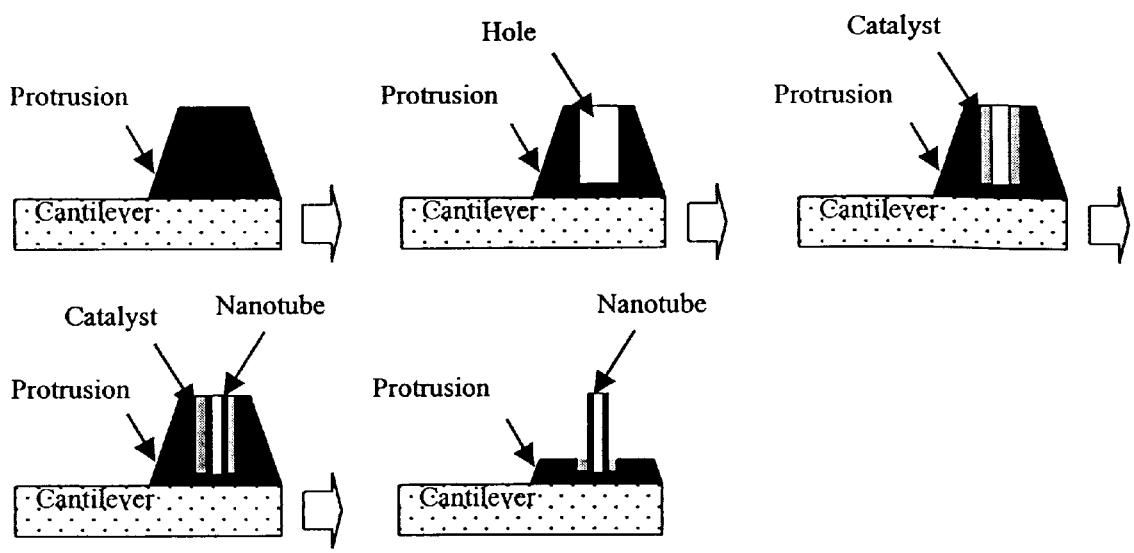
FIG. 2 illustrates the template methods for manufacturing carbon nanotube tips.
Figure 3:
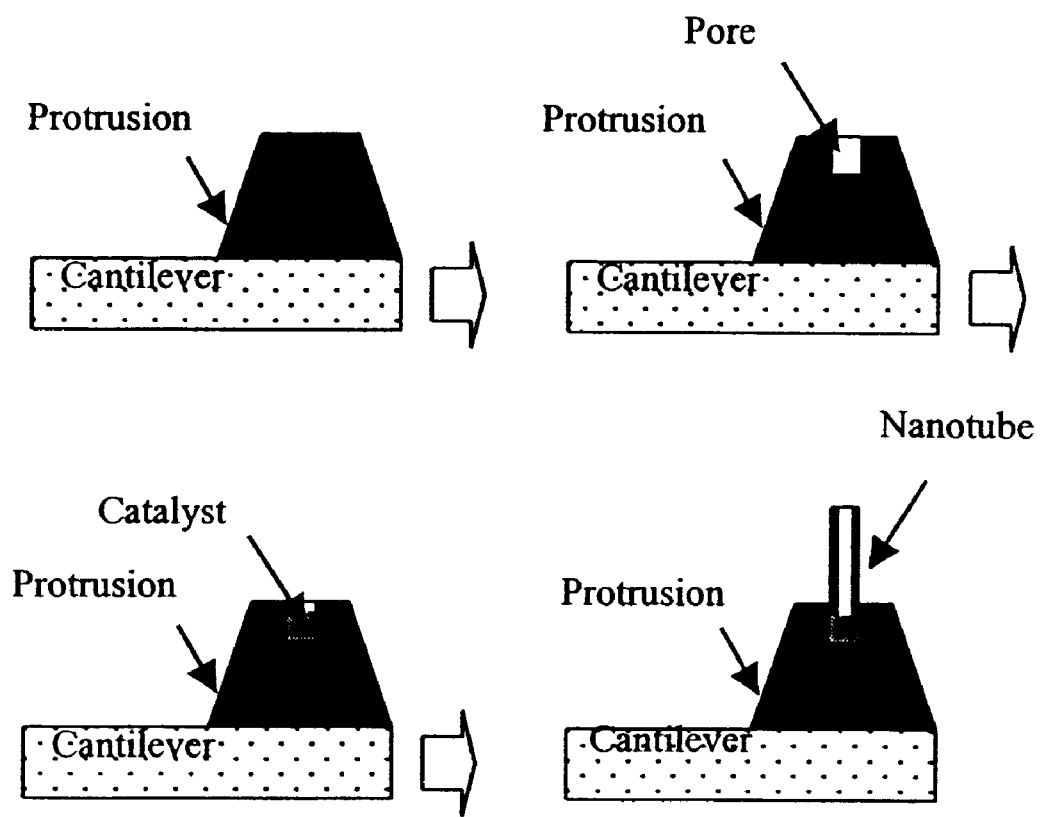
FIG. 3 illustrates the pore method for manufacturing carbon nanotube tips.

FIG. 2 illustrates the template methods for manufacturing carbon nanotube tips, while FIG. 3 illustrates the pore method for manufacturing carbon nanotube tips.

The method of the present invention works the best when materials and processes are as compatible as possible with the MEMS materials and processes. These include CVD methods to grow carbon nanotubes, nanohole fabrication methods, and catalyst deposition methods.

The requirements imposed by the functionality and the performance of the AFM cantilever drive the MEMS design, including the shape, dimensions, materials, and processes.

The intended use of an AFM cantilever with a carbon nanotube tip is to function as a metrology, mask repair, and possibly a lithography tool. However, the AFM cantilever with a carbon nanotube tip need not be limited to these functions.

Figure 4:
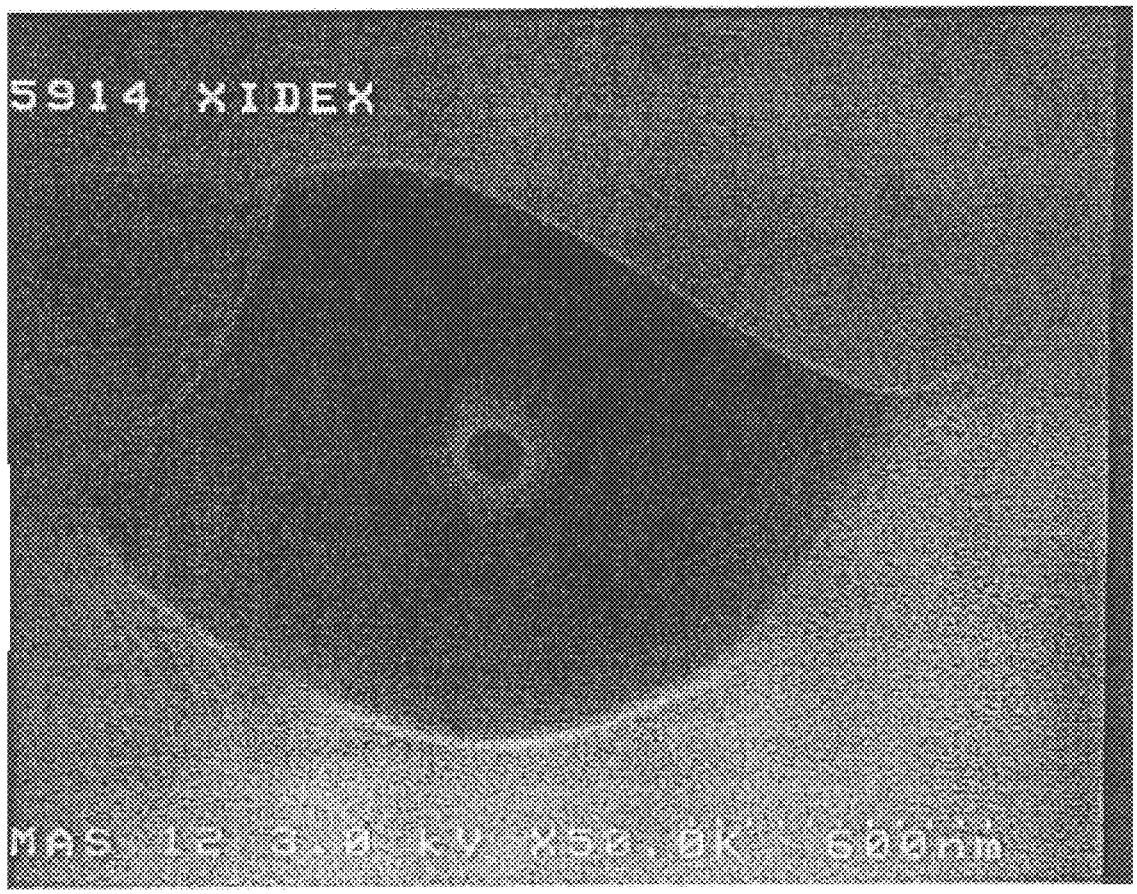
FIG. 4 shows a hole (NCRS) fabricated with controllable diameter, at a precise location on a substrate and with controllable depth.

A metrology tool must be capable of accessing deep trenches while vibrating with high frequency over the surface of a sample. To satisfy this general condition, the shape of the AFM cantilever has to allow access of the tip to all parts of the sample surface. A carbon nanotube tip grown directly on the cantilever itself would not have enough clearance to touch the sample surface. Therefore, cantilever 50 needs to provide the required clearance with a protrusion 52 or a larger blunt tip upon which the smaller carbon nanotube tip 54 would be grown as illustrated in FIG. 4. The protrusion 52 or the larger tip 54 has to have a shape that allows fabrication of an individual hole and adequate access for CVD to occur. If photoelectrochemical etching is used to fabricate the hole, the protrusion needs to be able to transmit light. Other functionality issues include: desired scanning speed, flexing of the carbon nanotube tip, the possibility of crashing of the tip, and bonding of the carbon nanotube tip with the cantilever substrate.

Geometrical and mechanical design are based upon existing MEMS fabrication technologies. This approach enables the manufacture of AFM cantilevers with aligned carbon nanotubes grown in place. A non-standard MEMS fabrication process, although feasible, might not be commercially viable. The cantilever design conforms to the restrictions addressed above.

Theoretically, the diameter, wall thickness, and length are determined as functions of the buckling forces required by the desired application (such as CD metrology, for example). To suit many AFM applications a carbon nanotube with diameter of 100 nm and less and length of 1 $\mu$m and more is very desirable.

For best results the method of the present invention uses materials that are compatible with existing micromachining technologies. Materials used with existing MEMS process are: crystalline silicon, polysilicon, silicon nitride, tungsten, and aluminum, for structural material; undoped silicon dioxide, doped silicon dioxide, polysilicon, and polymide, for sacrificial material; and fluorine-based acids, chlorine-based acids, and metallic hydroxides, for wet etching. The processes standard to existing MEMS technologies include: thin film deposition, oxidation, doping, lithography, chemical-mechanical polishing, etching, and packing. Other variations of the method involve process strategies for use when cantilever fabrication has to be interleaved with other (external to the MEMS fabrication) process steps, such as photoelectrochemical etching, electroplating, CVD, or etching.

The methods for NCRS fabrication of the present invention involve fabrication of an individual nanosize hole with the ability to control its alignment, diameter, depth, and location. Existing methods in growing nanotubes cannot fabricate an individual precisely-located hole. Existing methods rely on methods that produce an array of uniformly-distributed holes, and thus uniformly-distributed carbon nanotubes.

Geometrical requirements refer to the alignment, diameter, depth, and location of the hole to be fabricated. To make carbon nanotubes commercially useful as AFM tips, the diameter of the tip, and therefore the diameter of the hole used in fabricating the nanotube, has to be less than 100 nm. Smaller diameters may also be very desirable. Commercial carbon nanotube tips need to have an aspect ratio of about 10:1, which implies a length of about 1 $\mu$m for a 100 nm diameter tip.

Another important geometrical requirement is to have the holes orthoganal to the substrate so that the resulting grown carbon nanotubes are perpendicular to the surface of the substrate as well. Naturally, if the requirements are that the carbon nanotube form an angle with the surface of the substrate, than, the holes should be also fabricated with such an orientation.

The following technologies are capable of satisfying the above geometrical requirements: electrochemical or photo-electrochemical etching, micromachining and lithography. In addition, each technology offers several different variations of the nanotube growth method.

Electrochemical (EC) and photoelectrochemical (PEC) etching can be used to fabricate an individual nanosize hole at a specific location on a substrate. EC/PEC etching is a technology typically used to fabricate a porous silicon layer, where nano- and micro-size holes with uniform diameters are evenly spaced out onto the substrate. A porous silicon layer is fabricated by anodization of silicon in diluted HF under controlled current density. Porous silicon offers possibilities for applications including an insulating layer in silicon-on-insulator structures, optical applications, photoluminescence, electroluminescence, and micromachining of three-dimensional structures.

EC/PEC etching is used to control the number, diameter, shape, location, depth, and orientation of the holes. The existing EC/PEC etching process works well for mass fabrication of evenly distributed holes with precise diameters at random locations on a substrate. Hole diameter is precisely controlled with the current flux. Therefore different hole shapes are possible, including tapered or other variable diameter (over length) holes. The depth of the hole fabricated using EC/PEC etching is dependent upon the diameter of the hole. This dependence is attributed to the fact that, during EC/PEC etching, the hole grows in both the axial and radial direction, not simultaneously, but in a staircase way. In most cases the EC/PEC fabricated hole is perpendicular to the substrate, but a sloped hole can also be fabricated by controlling the orientation of the substrate, the placement of the current source anode/cathode, and the light source. Our method enables manufacture of only an individual nanosize hole at a specific desired location, with control over its diameter, shape, and depth.

Control over hole location and number is achieved by using means to initiate EC/PEC etching at desired locations. One way of achieving this initiation is to pattern the substrate with a mask to generate pits at precise locations on a substrate that will initiate formation of a NCRS. Another way of initiating the formation of the holes is to place an impurity, local defect, or stress as method to initiate the formation of a NCRS. The impurity, local defect, or stress can be placed using x-ray lithography, deep UV lithography, scanning probe lithography, electron beam lithography, ion beam lithography, optical lithography, electrochemical deposition, chemical deposition, electro-oxidation, electroplating, sputtering, thermal diffusion and evaporation, physical vapor deposition, sol-gel deposition, or chemical vapor deposition.

Another way to control the location and number of a NCRS is to use the geometry of the substrate to etch at desired location and do not etch at all or etch at different rates the areas surrounding the desired area. A pointy substrate (such as the AFM tip) the apex will etch a NCRS first, prior to any etching around it. In addition, if the AFM tip apex is sufficiently small only small number of holes will be etched. In extreme cases only one hole will be formed. In another scenario a V grove will etch first at the bottom before any etching around it.

Control over the NCRS size and shape is accomplished by using:

(1) the effects of the focusing, wavelength, and intensity changes of the light source for PEC etching, (2) the density and modulation changes of the current source, and (3) the dopant concentration.

Timing the duration of the PC/PEC etch can control the depth of the hole.

For best results materials are used that can be used to generate nanoporous silicon and which are also compatible with MEMS fabrication. For example, p doped silicon is suitable for both MEMS fabrication and porous silicon fabrication. Other MEMS and PEC compatible materials can also be used.

As an alternative to PEC etching, the method of the present invention uses micromachining technologies, such as ion milling, and e-beam micromachining, to fabricate an individual nanosize hole on specific location on an AFM cantilever. Existing ion milling (IM) and e-beam (EB) technologies can be used to fabricate holes with controllable diameter, at precise locations on a substrate (controllable location), and with controllable depth.

FIG. 4 shows a NCRS fabricated with controllable diameter, at a precise location on a substrate (controllable location), and with controllable depth.

The advantage of using IM and EB technologies to fabricate a NCRS is that they can produce holes with diameters as small as 10 nm. In addition, the location and dimension of a feature, including a hole, can be achieved with nanometer dimensional tolerances. Additionally, depths of hundreds of nanometers can be achieved with IM and EM. Because of their long use in the micromachining industry, IM and EM technologies are compatible with standard MEMS processes, which makes them very attractive.

The disadvantages of using IM and EB are their large capital and operating cost and low throughputs, which might not justify their use for mass production of AFM cantilevers with carbon nanotube tips. Since IM and EB can only fabricate features in a serial manner, each hole on an array of AFM cantilevers that can fit on a individual wafer would have to be fabricated individually in a stepping manner. This approach would require sophisticated navigating methods to fabricate the holes as precise locations.

The method of nanotube fabrication of the present invention also accommodates use of lithographic technologies, such as optical and scanning probe lithography, to fabricate an individual nanosize hole at specific location on the MEMS substrate. Existing optical and scanning probe lithographic technologies can be used to fabricate holes with controllable diameter, at precise locations on a substrate (controllable location), and with controllable depth. These methods include x-ray lithography, deep UV lithography, scanning probe lithography, electron beam lithography, ion beam lithography, and optical lithography.

Optical lithography is a technology capable of mass production of features, including the holes that we need for our project, with high throughput. Control of the location and dimension of features, such as the hole, can be performed with great critical dimension tolerances. This technology is compatible with standard MEMS processes. Since optical lithography only provides masking capabilities, the actual hole will be fabricated with etching. Fortunately, the existing etching and masking processes for optical lithography are very controllable. Therefore, the depth of the hole will depend on the masking and etching processes and is very controllable.

The main disadvantage of using standard optical lithography is that it can not produce holes with diameter of about 130–100 nm, which is the current feature size limitation of this technology. Such a large hole is unsuitable for growing carbon nanotubes with 100 nm or less diameter. However, this disadvantage may be overcome by filling-in larger diameter holes down to a desired sub 100 nm diameter. The filling-in can be done with the catalytic material or other suitable material. This filling-in process enables the use of optical lithography for rapidly and inexpensively fabricating holes suitable for growing carbon nanotubes. A potential disadvantage of using standard optical lithography is that the etching process for this technology might not be able to produce vertical holes with the high aspect ratio (10:1) that we need. To deal with this, we need proper mask design, photoresist, and etchants, necessary to fabricate a nanosize hole.

Scanning Probe Lithography can be used to fabricate features, including the holes, with great critical dimension tolerances of the location and dimension of the hole. An advantage of scanning probe lithography over optical lithography is that it can directly produce holes with diameters as low as 10 nm, which is very suitable for small-diameter carbon nanotubes.

Unlike optical lithography and more like micromachining technologies, scanning probe lithography has lower throughputs. As with the optical lithography, the etching process for this technology might not be able to produce vertical holes with high aspect ration (10:1)needed. To deal with this, proper tip radius, bias voltage, photoresist, and etchants are necessary to fabricate a nanosize hole. A high aspect ratio (10:1) vertical hole. The diameter of the hole can be reduced with similar or same methods as used to fabricate the hole or to coat a substrate, especially in the case of a larger diameter hole with a diameter greater than 100 nm. The hole is filled to reduce its inner diameter. This step enables the manufacture of larger diameter holes that are then reduced to a desired smaller diameter. This process is less demanding and less expensive for manufacturing. Optical lithography for example can be used to fabricate the holes.

The method of the present invention allows fabrication of an NCRS with precise dimensions and location that results in the synthesis of nanotubes with controlled size, shape, orientation, and location. The method can be implemented so as to be compatible with microelectromechanical manufacturing systems (MEMS) fabrication processes.

Selectively fabricating an individual NCRS with control over its diameter and length may require that the size of the NCRS be reduced with a process similar to those used in creating the layer in which the NCRS was fabricated. These processes include electrochemical deposition, chemical deposition, electro-oxidation, electroplating, sputtering, thermal diffusion and evaporation, physical vapor deposition, sol-gel deposition, and chemical vapor deposition to deposit said nanotube growth catalyst.

The filling-in can be done with the catalytic material or other suitable material. The fill-in of a NCRS can be achieved using the same methods that are used to deposit the catalyst. The methods include electrochemical deposition, chemical deposition, electro-oxidation, electroplating, sputtering, thermal diffusion and evaporation, physical vapor deposition, sol-gel deposition, chemical vapor deposition, and other methods known to those skilled in the art. In one variation the same catalyst that stimulates the growth of the carbon nanotube is used as the material for filling-in the holes. In this case, no additional catalyst deposition process is required.

Right amount of filling-in with a catalyst will also produce carbon nanotube growth that is smaller than the hole, therefore making small diameter carbon nanotubes with larger diameter holes.

A nanotube growth catalyst can be placed within an individual NCRS. The function of the metallic catalyst in the carbon nanotube growth process is to decompose the hydrocarbides and aid the deposition of ordered carbon. Common catalyst materials are iron, cobalt, and nickel. The oxide of the hole may also be used as catalysts for growing carbon nanotubes. Materials used in MEMS fabrication, such as Si and SiO2, are an example where we use a template made of Si which is electro-oxidized to produce SiO2 or SiO catalyst. The Si has to be doped to become conductive. Electro-oxidized Si is more porous than thermally grown oxide, which may affect nanotube growth.

Before a carbon nanotube can be grown from a template, the metallic catalyst must be deposited within it. A catalyst material in an individual template can be selectively deposited. Existing methods known to those skilled in the art can be used to deposit a metallic catalyst material evenly around the hole. Existing catalyst deposition methods include electrochemical deposition, chemical deposition, electro-oxidation, electroplating, sputtering, thermal diffusion and evaporation, physical vapor deposition, sol-gel deposition, and chemical vapor deposition.

Metallic catalysts can be deposited by chemical deposition immersing the substrate in Ni, Fe, and Co solutions (monomers). The substrate is then dried in H2 atmosphere (or any oxidizing agent for the monomer) to allow uniform deposition of the metal catalyst on the inner walls of the hole. The desired catalyst thickness on the template is controlled by the concentration of catalyst-resinate in the solution.

It is known that a carbon nanotube can be grown between a substrate and an anodic oxide film used as a catalyst via electro-oxidation. Changing the anodic oxidation time and the current density can control the inner diameter of the anodic oxide template. Changing the carbon deposition time can control the wall thickness of the nanotube. The length of the template determines the length of the carbon nanotube.

Catalyst deposition can be achieved by immersing the substrate with a NCRS in a solution of a catalyst and apply electrical potential to electroplate the holes.

It is known to those skilled in the art that sol-gel deposition can be used to coat the inside of a template with a semiconducting film. In this method, a porous aluminum membrane is first dipped into sol-gel solution. Afterward, the membrane is removed from the sol-gel solution and dried. The result is tubules or fibrils within the pores of the membrane. Tubules or fibrils are obtained depending on the temperature of the sol-gel solution. The wall thickness of the tubules depends on the immersion time. In the method of the present invention, the sol-gel method is used to deposit metal catalysts, such as Ni, Fe and Co, instead of semiconductor materials.

Chemical vapor deposition is the most commonly used means of depositing thin films. The method of the present invention uses CVD to coat the walls of a nanosized template with Fe, Ni or Co catalyst. Required reaction temperature, amount of precursor, and deposition time.

Pore sol-gel deposition can be used to deposit metal catalysts instead of semiconductor materials. This process can produce short fibrils instead of tubules. The short fibrils can act as embedded catalytic particles.

Electrochemical plating requires catalyst solutions with concentrations needed to coat the pore, the current densities that will produce electroplating and the time of deposition that is controlled. In another embodiment of the present invention, the above electrochemical plating process on a substrate with materials that can also be used with MEMS fabrication. To satisfy the geometrical constrains of this method, a cathode metal must be placed on the closed side of the hole.

In all of the above methods unwanted catalyst may be deposited outside of the hole where the carbon nanotube will grow and should be removed. Methods of removal include:

(1) ion blowing by blowing ions at oblique angle with the substrate as not to remove the catalyst from within the hole;

(2) chemical submersion for a time interval too short to allow the rinsing of the catalyst within the hole but sufficient to rinse the surface; and (3) magnetic removal of the magnetic catalyst.

Synthesis of the nanotubes can be manipulated chemical vapor deposition (CVD) process parameters. A design of experiment (DOE) may examine how process parameters such as selection of a CVD precursor gas temperature and reaction time effect nanotube growth. Allowing one to maniplate the parameters to achieve a desired result.

With the template method, the precursors, the reaction temperature, and the reaction times are optimized to implement the five basic process steps while remaining compatible with standard MEMS technology.

Aligned carbon nanotubes can also be synthesized by thermal deposition of hydrocarbides. The hydrocarbides used as precursors can be ethylene, acetylene, and methane. Carrier gas can be argon and nitrogen.

The template method requires CVD reaction temperatures ranging from 545 C. to 900 C. The specific reaction temperature used depends on the type of catalyst and the type of precursor. Energy balance equations for the respective chemical reactions are used to analytically determine the optimum CVD reaction temperature to grow carbon nanotubes. This determines the required reaction temperature ranges. The optimum reaction temperature also depends on the flow rates of the selected precursor and the catalyst.

In the template method the reaction time is used to control the wall thickness of the carbon nanotube. Since the growth of the nanotube is radially inward and fully contained within the template, longer reaction times produce nanotubes with thicker walls.

The reaction time is increased to achieve a thicker wall thickness some models for wall thickness growth assume that the carbon nanotube wall thickness growth rate is truly proportional to the CVD deposition time. The increased reaction time improves crystallization of the nanotube and decreases unwanted graphitization. A variation of the method involves tailoring the reaction time so as to produce a single-wall carbon nanotube and still obtain a highly crystallized carbon nanotube. Still another variation of the method involves controlling wall thickness without depending on the reaction time by Ni catalyst with pyrene precursor, a process known to yield thin carbon nanotube walls regardless of the time of CVD reaction.

The quality of carbon nanotubes synthesized depends on the catalyst, the precursors, the reaction temperatures and the reaction times. Nanotube quality also depended on substrate geometry (diameter and pore orientation). The proper alignment of the carbon nanotubes depends on the pore orientation.

Unlike the template method, where reaction time determined wall thickness, in the pore method reaction time determines the nanotube length. Longer reaction times produce longer nanotubes where the nanotubes can protrude past the surface of the pore. The reaction times have to be determined to produce carbon nanotubes that are about 1 $\mu$m long, as required for an AFM tip. With the pore method there are no known means to control the wall thickness. Means to control nanotube wall thickness is gassification of the synthesized carbon nanotubes.

Some instances require that the synthesized carbon nanotube be uncovered without damage. This step is accomplished by selecting uncovering etchants and determining optimum uncovering times. In these instances the carbon nanotubes grown using the template method are uncovered as the template layer itself is removed. After which the carbon nanotubes are purified. To function as AFM tips, carbon nanotubes grown with the CVD template method must be uncovered from the template. An uncovered carbon nanotube must protrude at least 1 $\mu$m from the substrate, while its root must remain integrated with the substrate.

The most common, and reliable, method to uncover the carbon nanotubes is wet and dry etching. The method of the present invention uses standard wet etchants and a large knowledge base about their use with different MEMS-compatible substrate materials to control the uncovering process.

Knowledge of etchants properties is combined with the etching requirements and used to select the best etchant for the materials for the process. The etching requirements include the desired etching rates and the type of etching that we need, isotropic or anisotropic. The rates of anisotropic etching depend on the crystallography of the etched material, and anisotropic etching is mainly used for bulk-type MEMS fabrication. Isotropic etching is mainly used for surface-type micromachining MEMS fabrication. The selected etchant might be an individual etchant, diluted etchant or a combination of few etchants mixed proportionally.

The etchant must also be MEMS compatible. Etchants known to be compatible with MEMS fabrication include KOH, HF, HF:HCl, H3PO4, and NaOH but need not be limited to these etchants. There is a possibility that the uncovering etchant may react with the SiO2 and silicon nitrides that are used as sacrificial materials in cantilever fabrication. These sacrificial layers are used to hold the cantilever in place until all processes, including the uncovering of the carbon nanotube, are completed. A reaction between the uncovering etchant and the sacrificial material may release the cantilever prematurely. This situation, as part of the MEMS fabrication process, allows the uncovering etchant to be used simultaneously as a cantilever release etchant.

Timing of the wet etching is also used as a means to control the nanotube's length, namely how far it protrudes from the bottom of the substrate. A crucial step in controlling nanotube length is to time the etching process so as to only expose the desired length of the nanotube and keep part of it buried in the substrate for structural support.

For the etchant and the substrate chosen, the etching rate can be empirically determined or is known. Knowing the etching rate, the etching time that results in uncovering the desired length of nanotube is calculated. The desired total length of the carbon nanotube is the length of the template. The length of nanotube that must remain embedded in the substrate determines the depth to which the template must be etched away. The depth to which the nanotube has to be embedded in the substrate is a function of the AFM tip's required strength.

For the special case in which the etchant simultaneously releases the cantilever and uncover the nanotube, one can analytically determine the optimum etching time. However, this prediction is more complicated. First, the etching time for the uncovering process as described above is determined. Then, how deep the sacrificial layer (with different material) must be to dissolve simultaneously is determined. The calculation must also account for the difference in vertical and lateral etching rates for the same etchant and etched material. This is an important issue since the sacrificial material under the cantilever must be removed by vertical and lateral etching.

Multilayer strategy as uncovering method is another variation involving the use of two layers of template substrate where the top layer is non-resistant to etchant and the bottom layer is resistant to etchant. This multilayer strategy makes the nanotube uncovering process self regulating. This approach also provides an effective way to precisely control the length of the carbon nanotube tip.

Although the present invention has been described in detail, it should be understood that various changes, substitutions and alterations can be made hereto without departing from the spirit and scope of the invention as described by the appended claims.

What is claimed is:

1. A method for manufacturing at least one carbon nanotube as a functional elements of a MEMS device, comprising the steps of:
    preparing a MEMS substrate for growth of the at least one carbon nanotube;
    creating a nanosize catalyst retaining structure in a first layer at a location on said MEMS substrate, wherein said location determines a position of the at least one carbon nanotube on said MEMS substrate;
    placing a nanotube catalyst within said nanosize catalyst retaining structure; and
    synthesizing the at least one carbon nanotube within said catalyst retaining structure.
2. The method of claim 1, further comprising the step of:
    removing said first layer from said MEMS substrate to reveal said nanotube wherein said first layer is a sacrificial layer.
3. The method of claim 1, wherein said nanosize catalyst retaining structure has a controlled location, orientation, shape, diameter and depth.
4. The method of claim 1, wherein said nanosize catalyst retaining structure serves as a template to control location, orientation, shape, diameter and length of the at least one carbon nanotube.
5. The method of claim 1, wherein said nanosize catalyst retaining structure controls the diameter of the at least one carbon nanotube.
6. The method of claim 1, wherein said nanosize catalyst retaining structure controls a length of the at least one carbon nanotube.
7. The method of claim 1, wherein said nanosize catalyst retaining structure controls an orientation of the at least one carbon nanotube with respect to said MEMS substrate.
8. The method of claim 1, wherein an orientation of the at least one carbon nanotube with respect to said MEMS substrate is at an angle to said MEMS substrate.
9. The method of claim 8, wherein said orientation of the at least one carbon nanotube with respect to said MEMS substrate is orthoganal to said MEMS substrate.
10. The method of claim 1, wherein said step of creating a nanosize catalyst retaining structure at a location on said MEMS substrate is an electrochemical process.
11. The method of claim 1, wherein said step of creating a nanosize catalyst retaining structure at a location on said MEMS substrate is a photoelectrochemical etching process.
12. The method of claim 1, wherein said step of creating a nanosize catalyst retaining structure at a location on said MEMS substrate is an electrochemical etching process.
13. The method of claim 1, wherein said step of creating a nanosize catalyst retaining structure at a location on said MEMS substrate is mechanical process.
14. The method of claim 1, wherein said step of creating a nanosize catalyst retaining structure at a location on said MEMS substrate is accomplished with an electron beam.
15. The method of claim 1, wherein said step of creating a nanosize catalyst retaining structure at a location on said MEMS substrate is accomplished with an ion beam.
16. The method of claim 1, wherein said step of creating a nanosize catalyst retaining structure at a location on said MEMS substrate is an lithography process, wherein said lithography process is a process selected from the group consisting of x-ray lithography, deep UV lithography, scanning probe lithography, electron beam lithography, ion beam lithography, and optical lithography.
17. The method of claim 1, wherein said step of placing said nanotube catalyst within said nanosize catalyst retaining structure uses a process selected from the group consisting of electrochemical deposition, chemical deposition, electrooxidation, electroplating, sputtering, thermal diffusion and evaporation, physical vapor deposition, sol-gel deposition, and chemical vapor deposition to deposit said nanotube catalyst.
18. The method of claim 1, wherein said step of synthesizing said nanotube within said nanosize catalyst retaining structure comprises thermal deposition of hydrocarbides.
19. The method of claim 1, wherein said step of synthesizing said nanotube within said nanosize catalyst retaining structure comprises a chemical vapor deposition process wherein a reaction time of said chemical vapor deposition process is manipulated to control a length of the at least one carbon nanotube.
20. The method of claim 1, wherein said step of synthesizing said nanotube within said nanosize catalyst retaining structure comprises a chemical vapor deposition process wherein a process parameter of said chemical vapor deposition process is manipulated to control a wall thickness of the at least one carbon nanotube.
21. The method of claim 1, further comprising the step of reducing a diameter of said nanosize catalyst retaining structure.

22. The method of claim 21, wherein said step of reducing a diameter of said nanosize catalyst retaining structure and placing involves filling-in said nanosize catalyst retaining structure with a process selected from the group consisting of electrochemical deposition, chemical deposition, electro-oxidation, electroplating, sputtering, thermal diffusion and evaporation, physical vapor deposition, sol-gel deposition, and chemical vapor deposition.

23. The method of claim 21, wherein said step of reducing a diameter of said nanosize catalyst retaining structure and placing said nanotube catalyst within said nanosize catalyst retaining structure are performed simultaneously and wherein said step of reducing said diameter of said nanosize catalyst retaining structure uses a process selected from the group consisting of electrochemical deposition, chemical deposition, electro-oxidation, electroplating, sputtering, thermal diffusion and evaporation, physical vapor deposition, sol-gel deposition, and chemical vapor deposition, and wherein said step of placing said nanotube catalyst within said nanosize catalyst retaining structure uses a process selected from the group consisting of electro-chemical deposition, chemical deposition, electro-oxidation, electroplating, sputtering, thermal diffusion and evaporation, physical vapor deposition, sol-gel deposition, and chemical vapor deposition.

24. The method of claim 1, further comprising purifying said nanotube.

25. The method of claim 1, wherein said MEMS substrate is an AFM cantilever.

26. The method of claim 1, wherein the carbon nanotube has a diameter less than 100 nm.

27. The method of claim 1, wherein the carbon nanotube has an aspect ratio of 10:1 with a diameter less than 100 nm.

28. The method of claim 1, wherein said nanosize catalyst retaining structure has a varying diameter which produces said nanotube with a varying diameter.

29. The method of claim 1, wherein said nanosize catalyst retaining structure has a varying vertical profile which produces said nanotube with a varying vertical profile.

30. The method of claim 1, wherein said nanosize catalyst retaining structure has a tapered vertical profile which produces said nanotube with a tapered vertical profile.

31. The method of claim 1 further comprising the steps of:
depositing at least one second layer at a location on said MEMS substrate;
creating a second nanosize catalyst retaining structure in said at least one second layer at a location on said MEMS substrate;
depositing said nanotube catalyst within said second nanosize catalyst retaining structure; and
growing a second nanotube within said second nanosize catalyst retaining structure.

32. The method of claim 31, further comprising the steps of:
removing said at least one second layer from said MEMS substrate to reveal said nanotube and wherein said second layer is a sacrificial layer.

33. The method of claim 1, wherein said nanosize catalyst structure has a geometry selected from at least one of the geometries selected from the group consisting of cylindrical, spherical, toroid, helical.

34. A method for manufacturing at least one carbon nanotube as a functional elements of a MEMS device, comprising the steps of:
preparing a MEMS substrate for growth of the at least one carbon nanotube;
creating a nanosize catalyst retaining structure in a first layer at a location on said MEMS substrate, wherein said location determines a position of the at least one carbon nanotube on said MEMS substrate;
placing a nanotube catalyst on a lower surface within said nanosize catalyst retaining structure; and
synthesizing the at least one carbon nanotube within said catalyst retaining structure.

35. The method of claim 34, further comprising the step of:
removing said first layer from said MEMS substrate to reveal said nanotube wherein said first layer is a sacrificial layer.

36. The method of claim 34, wherein said nanosize catalyst retaining structure has a controlled location, orientation, shape, diameter and depth.

37. The method of claim 34, wherein said nanosize catalyst retaining structure serves as a pore to control location, orientation, and diameter of the at least one carbon nanotube.

38. The method of claim 34, wherein said nanosize catalyst retaining structure controls the diameter of the at least one carbon nanotube.

39. The method of claim 34, wherein said nanosize catalyst retaining structure controls an orientation of the at least one carbon nanotube with respect to said MEMS substrate.

40. The method of claim 34, wherein an orientation of the at least one carbon nanotube with respect to said MEMS substrate is at an angle to said MEMS substrate.

41. The method of claim 34, wherein an orientation of the at least one carbon nanotube with respect to said MEMS substrate is orthoganal to said MEMS substrate.

42. The method of claim 34, wherein said step of creating a nanosize catalyst retaining structure at a location on said MEMS substrate is a process selected from the group consisting of electrochemical process, photoelectrochemical etching process, electrochemical etching process, a mechanical process, an electron beam process, an ion beam process, and a lithography process, wherein said lithography process is a process selected from the group consisting of x-ray lithography, deep UV lithography, scanning probe lithography, electron beam lithography, ion beam lithography, and optical lithography.

43. The method of claim 34, wherein said step of placing said nanotube catalyst within said nanosize catalyst retaining structure uses a process selected from the group consisting of electrochemical deposition, chemical deposition, electro-oxidation, electroplating, sputtering, thermal diffusion and evaporation, physical vapor deposition, sol-gel deposition, and chemical vapor deposition.

44. The method of claim 34, wherein said step of synthesizing said nanotube within said nanosize catalyst retaining structure comprises thermal deposition of hydrocarbides.

45. The method of claim 34, wherein said step of synthesizing said nanotube within said nanosize catalyst retaining structure comprises a chemical vapor deposition process wherein a reaction time of said chemical vapor deposition process is manipulated to control a length of the at least one carbon nanotube.

46. The method of claim 34, wherein said step of synthesizing said nanotube within said nanosize catalyst retaining structure comprises a chemical vapor deposition process wherein a process parameter of said chemical vapor deposition process is manipulated to control a wall thickness of the at least one carbon nanotube.

47. The method of claim 34, further comprising the step of reducing a diameter of said nanosize catalyst retaining structure.

48. The method of claim 47, wherein said step of reducing a diameter of said nanosize catalyst retaining structure and placing involves filling-in said nanosize catalyst retaining structure with a process selected from the group consisting of electrochemical deposition, chemical deposition, electro-oxidation, electroplating, sputtering, thermal diffusion and evaporation, physical vapor deposition, sol-gel deposition, and chemical vapor deposition.

49. The method of claim 47, wherein said step of reducing a diameter of said nanosize catalyst retaining structure and placing said nanotube catalyst within said nanosize catalyst retaining structure are performed simultaneously and wherein said step of reducing said diameter of said nanosize catalyst retaining structure uses a process selected from the group consisting of electrochemical deposition, chemical deposition, electro-oxidation, electroplating, sputtering, thermal diffusion and evaporation, physical vapor deposition, sol-gel deposition, and chemical vapor deposition, and wherein said step of placing said nanotube catalyst within said nanosize catalyst retaining structure uses a process selected from the group consisting of electro-chemical deposition, chemical deposition, electro-oxidation, electroplating, sputtering, thermal diffusion and evaporation, physical vapor deposition, sol-gel deposition, and chemical vapor deposition to deposit said nanotube catalyst.

50. The method of claim 34, further comprising purifying said nanotube.

51. The method of claim 34, wherein said MEMS substrate is an AFM cantilever.

52. The method of claim 34, wherein the carbon nanotube has a diameter less than 100 nm.

53. The method of claim 34, wherein the carbon nanotube has an aspect ratio of 10:1 with a diameter less than 100 nm.

54. The method of claim 34, further comprising the steps of:
- depositing at least one second layer at a location on said MEMS substrate;
- creating a second nanosize catalyst retaining structure in said at least one second layer at a location on said MEMS substrate;
- depositing said nanotube catalyst within said second nanosize catalyst retaining structure; and
- growing a second nanotube within said second nanosize catalyst retaining structure.

55. The method of claim 54, further comprising the steps of:
- removing said at least one second layer from said MEMS substrate to reveal said nanotube and wherein said second layer is a sacrificial layer.

56. A method for manufacturing patterns of carbon nanotubes as functional elements of MEMS devices, comprising the steps of:
- preparing a MEMS substrate for growth of the patterns of carbon nanotubes;
- creating a nanosize catalyst retaining structure in a first layer at a location on said MEMS substrate, wherein said location determines a position of the patterns of carbon nanotubes on said MEMS substrate;
- placing a nanotube catalyst within said nanosize catalyst retaining structure; and
- synthesizing the patterns of carbon nanotubes within said catalyst retaining structure.

57. The method of claim 56, further comprising the step of:
- removing said first layer from said MEMS substrate to reveal the patterns of carbon nanotubes wherein said first layer is a sacrificial layer.

58. The method of claim 56, wherein said nanosize catalyst retaining structure has a controlled location, orientation, shape, diameter and depth.

59. The method of claim 56, wherein said nanosize catalyst retaining structure serves as a template to control location, orientation, shape, diameter and length of the patterns of carbon nanotubes.

60. The method of claim 56, wherein said step of creating a nanosize catalyst retaining structure at a location on said MEMS substrate is a process selected from the group consisting of an electrochemical process, photoelectro-chemical etching process, an electrochemical etching process, mechanical process, an electron beam process, an ion beam process and a lithography process, wherein said lithography process is a process selected from the group consisting of x-ray lithography, deep UV lithography, scanning probe lithography, electron beam lithography, ion beam lithography, and optical lithography.

61. The method of claim 56, wherein said step of placing said nanotube catalyst within said nanosize catalyst retaining structure uses a process selected from the group consisting of chemical deposition, electro-oxidation, electroplating, sputtering, physical vapor deposition and chemical vapor deposition to deposit said nanotube catalyst.

62. The method of claim 56, wherein said step of synthesizing said nanotube within said nanosize catalyst retaining structure comprises thermal deposition of hydrocarbides.

63. The method of claim 56, wherein said step of synthesizing said nanotube within said nanosize catalyst retaining structure comprises a chemical vapor deposition process wherein a reaction time of said chemical vapor deposition process is manipulated to control a length of the patterns of carbon nanotubes.

64. The method of claim 56, wherein said step of synthesizing said nanotube within said nanosize catalyst retaining structure comprises a chemical vapor deposition process wherein a process parameter of said chemical vapor deposition process is manipulated to control a wall thickness of the patterns of carbon nanotubes.

65. The method of claim 56, further comprising purifying said patterns of carbon nanotubes.

66. The method of claim 56, further comprising the steps of:
- depositing at least one second layer at a location on said MEMS substrate;
- creating a second nanosize catalyst retaining structure in said at least one second layer at a location on said MEMS substrate;
- depositing said nanotube catalyst within said second nanosize catalyst retaining structure; and
- growing a second pattern of carbon nanotubes within said second nanosize catalyst retaining structure.

67. The method of claim 66, further comprising the steps of:
- removing said at least one second layer from said MEMS substrate to reveal said nanotube and wherein said second layer is a sacrificial layer.

68. The method of claim 1, wherein said first layer comprises a template of two distinct layers, a top layer and a bottom layer wherein said top and said bottom layer have differing selectivities to an etchant, wherein a process of uncovering said at least one nanotube is self regulating because of the differing selectivities and wherein said step of synthesizing said at least one carbon nanotube is effected by a grain size of a wall of said nanosize catalyst retaining structure.

69. A method for manufacturing at least one carbon nanotube, comprising the steps of:
   creating at least one nanosized catalyst retaining structure; and
   forming the at least one carbon nanotube within said at least one nanosized catalyst retaining structure.

* * * * *